United States Patent [19]

Moore et al.

[11] Patent Number: 5,641,695

[45] Date of Patent: Jun. 24, 1997

[54] METHOD OF FORMING A SILICON CARBIDE JFET

[75] Inventors: Karen E. Moore, Phoenix; Charles E. Weitzel, Mesa, both of Ariz.

[73] Assignee: Motorola, Schaumburg, Ill.

[21] Appl. No.: 538,063

[22] Filed: Oct. 2, 1995

[51] Int. Cl.[6] .......................... H01L 21/265; H01L 21/20
[52] U.S. Cl. .......................... 438/186; 438/931; 438/945
[58] Field of Search .............................. 437/40 JF, 41 JF, 437/100, 911; 257/77, 272, 273, 274, 275, 276, 277, 278

[56] References Cited

U.S. PATENT DOCUMENTS 5,378,642  1/1995  Brown et al. .......................... 437/100

Primary Examiner—John Niebling
Assistant Examiner—Brian K. Dutton
Attorney, Agent, or Firm—Eugene A. Parsons

[57] ABSTRACT

An implant mask (14) and an etch mask (16) are utilized in forming a silicon carbide JFET (10). A source opening (17) and a drain opening (18) are formed in the masks (14,16). The etch mask (16) is removed, and a source area (19) and a drain area 21 are implanted through the openings (17,18) and source and drain contact (23, 24) are formed. A protective layer (26) is used to form source and drain contacts (23,24). A gate contact (27) is utilized to ensure the gate (28) is self-aligned to the gate contact (27).

12 Claims, 1 Drawing Sheet

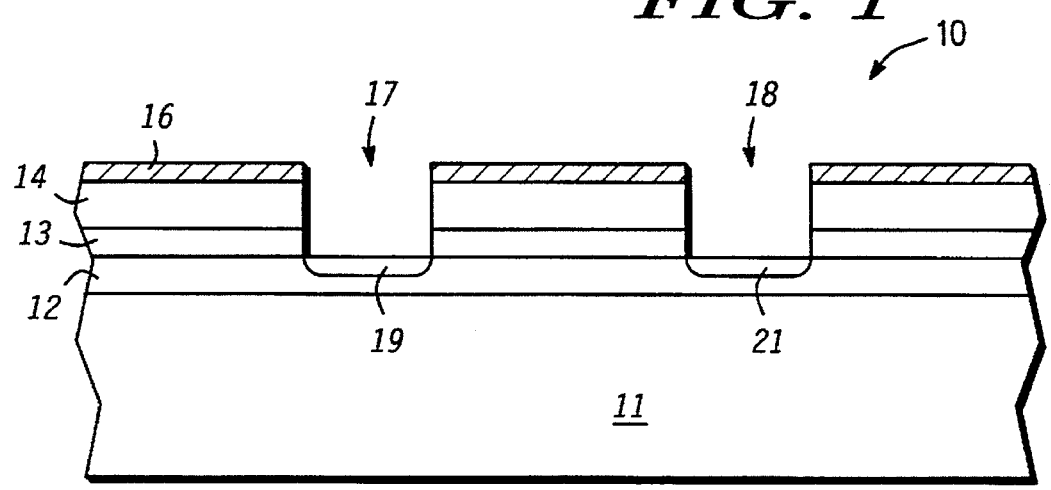
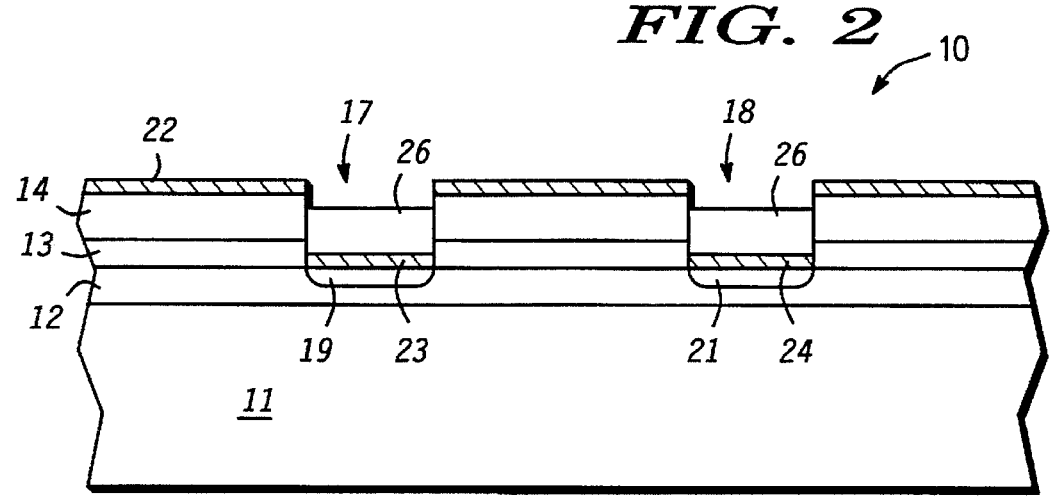
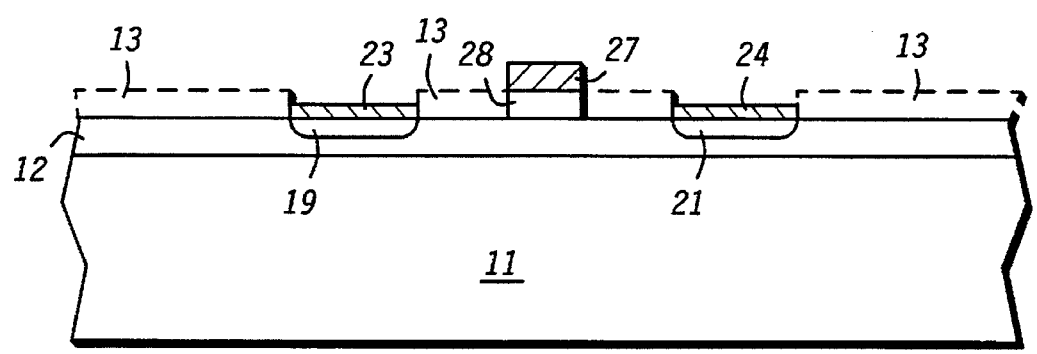

METHOD OF FORMING A SILICON CARBIDE JFET

BACKGROUND OF THE INVENTION

The present invention relates, in general, to semiconductor devices, and more particularly, to methods of forming silicon carbide semiconductor devices.

In the past, a variety of methods have been utilized to form silicon carbide junction field effect transistors (JFETs). However, with these prior methods it is difficult to obtain accurate registration between the gate contact and the gate material.

Additionally, the very high temperatures required to form source and drain contacts, typically greater than 900° C., generally requires that gate contacts be applied after the source and drain contact annealing. Consequently, source and drain contacts typically have some misalignment to the source and drain areas. Additionally, extra distance must be provided between the gate and the source and drain areas in order to prevent shorts therebetween, thus, the resulting transistor has a large size and degraded device performance.

Accordingly, it is desirable to have a method of forming a silicon carbide JFET that provides source and drain contacts that are self-aligned to the source and drain areas, that provides for annealing of the source and drain contacts prior to forming the gate contact, and that provides a gate contact that is self-aligned to the gate area.

BRIEF DESCRIPTION OF THE DRAWINGS

FIG. 1 illustrates an enlarged cross-sectional portion of a transistor at a stage in manufacturing in accordance with the present invention;

FIG. 2 illustrates a subsequent stage in the manufacture of the transistor of FIG. 1 in accordance with the present invention; and FIG. 3 illustrates an enlarged cross-sectional portion of a subsequent stage in the manufacture of the transistor of FIG. 2 in accordance with the present invention.

DETAILED DESCRIPTION OF THE DRAWINGS

FIG. 1 illustrates an enlarged cross-sectional portion of a silicon carbide junction field effect transistor (JFET) 10 at a stage of manufacturing. Transistor 10 includes a silicon carbide substrate 11 onto which an N-type silicon carbide channel layer 12 is epitaxially formed. A P-type silicon carbide gate layer 13 is epitaxially formed on layer 12, and will subsequently be utilized to form the gate of transistor 10 as will be seen hereinafter. In some cases, an epitaxial P-type buffer layer can be formed between substrate 11 and layer 12. Layers 12 and 13 are formed by epitaxial techniques that are well known to those skilled in the art.

An implant mask 14 is formed on layer 13 and will subsequently be utilized as a mask for forming a source area 19 and a drain area 21 as will be seen hereinafter. The material utilized for mask 14 should be suitable for withstanding implant and activation temperatures to which mask 14 will subsequently be exposed. Such materials include polysilicon, silicon dioxide, and polycrystalline silicon carbide. In the preferred embodiment, mask 14 is approximately 0.5 to 1.0 microns of polysilicon in order to withstand such procedures.

An etch mask 16 is applied to mask 14 and will subsequently be utilized as a mask for etching through silicon carbide gate layer 13. The material utilized for mask 16 should be a material that is relatively unaffected by the plasma chemistry utilized to etch silicon carbide so that material does not sputter from mask 16 onto transistor 10. Suitable materials for etch mask 16 include platinum, lanthanum hexaboride ($LAB_6$), and nickel. In the preferred embodiment, a layer of nickel is utilized for mask 16. Mask 16 is patterned to form a source opening 17 and a drain opening 18 thereby exposing portions of the surface of implant mask 14. The exposed portions of mask 14 are etched thereby extending source opening 17 and drain opening 18 through implant mask 14. Subsequently, gate layer 13 is etched through openings 17 and 18 to expose portions of the surface of channel layer 12. It is important that the etch chemistry utilized produces substantially vertical walls in opening 17 and 18 in order to facilitate self-aligning source and drain areas to source and drain contacts as will be seen hereinafter. In the preferred embodiment, mask 16 is patterned by an E-beam mask and etched with nitric acid. Additionally, stepper masking techniques can be utilized for forming mask 16. E-beam and stepper masking techniques for patterning mask 16, and plasma etching techniques for etching mask 14 and layers 12 and 13 are well known to those skilled in the art.

FIG. 2 is an enlarged cross-sectional portion of transistor 10 at a subsequent formation stage. Portions of FIG. 2 that have the same reference numerals as FIG. 1 are the same as the corresponding FIG. 1 elements. Etch mask 16 (FIG. 1) is removed, for example by a nitric acid etch. Then, dopants are implanted, into layer 12 through openings 17 and 18 and activated to form source area 19 and drain area 21. Typically, temperatures of approximately 25° C. to 800° C. are utilized during the implanting operation, and temperatures of approximately 1200° C. to 1700° C. are utilized to activate the dopants.

A source ohmic contact 23 and a drain ohmic contact 24 are formed on areas 19 and 21, respectively, by evaporating ohmic contact material onto areas 19 and 21. During the evaporation, ohmic contact material 22 is also formed on the surface of mask 14. Evaporation is utilized to ensure that material 22 is not deposited onto the sidewalls of openings 17 and 18 in order to prevent electrical shorts between the subsequently formed gate and contacts 23 and 24. Other techniques that ensure the ohmic contact material is not formed on the sidewalls can be used. In the preferred embodiment, the polysilicon utilized for mask 14 also assists in making material 22 discontinuous and also assists in preventing shorts. Thereafter, a protective layer 26 is formed on contacts 23 and 24 to protect contacts 23 and 24 during removal of material 22 from the surface of mask 14. In the preferred embodiment, a spin-on glass is utilized to form protective layer 26.

FIG. 3 illustrates an enlarged cross-sectional portion of transistor 10 at a subsequent manufacturing stage. Elements of FIG. 3 that have the same reference numerals as FIG. 1 and FIG. 2 are the same as the corresponding elements. Material 22 (FIG. 2) is removed from the surface of mask 14 leaving contacts 23 and 24 on areas 19 and 21, respectively. Thereafter, mask 14 (FIG. 2) is removed followed by removal of layer 26 (FIG. 2) thereby exposing the surface of gate layer 13. It should be noted that mask 14 could also be removed prior to activating the implants used to form areas 19 and 21. Subsequently, contacts 23 and 24 are annealed, typically at temperatures between 850° C. to 1050° C.

A lift-off technique is utilized to form a gate contact 27 on the surface of layer 13. Layer 13 is shown in phantom to illustrate the removed portion of layer 13. Gate contact material is applied to layer 13, and undesired portions are removed by lift-off leaving gate contact 27 on layer 13 between areas 19 and 21. Contact 27 is utilized as a mask while removing portions of gate layer 13 that are not covered by contact 27 in order to form a gate 28 on the surface of channel layer 12 between areas 19 and 21. Contact 27 can be a variety of materials including titanium/gold, platinum/gold, and platinum/titanium/gold.

By now it should be appreciated there has been provided a novel method to form a silicon carbide JFET. Forming the source and drain areas prior to the gate contact ensures that the gate contact is not exposed to the detrimental high temperatures utilized to anneal source and drain contacts. Such a sequence of activating and annealing results in high quality ohmic contacts and a very high integrity gate contact thereby improving the reliability of the transistor. Utilizing the same mask to form both source and drain contacts and source and drain implants, results in contacts that are self-aligned to the source and drain areas which also provides improved alignment control. Utilizing a single mask step to form the gate contact and utilizing the gate contact as a mask for forming the gate, ensures that the gate contact is self-aligned to the gate thereby providing closer source-to-drain spacings and source-to-gate spacings which result in a higher frequency response and higher power output and efficiency.

We claim:

1. A method of forming a silicon carbide JFET comprising:

providing a silicon carbide substrate having a channel layer on the substrate and a gate layer on the channel layer;

forming a mask on the gate layer;

implanting dopants into the channel layer to form source and drain areas;

removing the mask;

activating the dopants in the channel layer;

applying ohmic contact material onto the source and drain areas;

covering the ohmic contact material that is on the source and drain areas with a protective layer;

removing the protective layer;

annealing the ohmic contact material that is on the source and drain areas;

forming a gate contact on the gate layer between the source and drain areas; and using the gate contact as a mask while removing any of the gate layer not covered by the gate contact.

2. The method of claim 1 wherein implanting the source and drain areas in the channel layer includes forming source and drain openings through the mask and the gate layer, and implanting through the source and drain openings.

3. The method of claim 1 wherein forming the mask on the gate layer includes forming an implant mask on the gate layer and forming an etch mask on the implant mask.

4. The method of claim 3 wherein removing the mask includes removing the etch mask and leaving the implant mask.

5. The method of claim 1 wherein forming the mask on the gate layer includes forming a layer of material that is one of nickel, platinum, and lanthanum hexaboride then patterning the layer of material.

6. The method of claim 1 wherein covering the ohmic contact material that is on the source and drain areas includes removing any ohmic contact material that is not on the source and drain areas.

7. A method of forming a silicon carbide JFET comprising:

providing a silicon carbide substrate having a silicon carbide channel layer on the substrate;

forming a silicon carbide gate layer on the channel layer;

forming an implant mask on the gate layer;

applying an etch mask on the implant mask;

forming a source opening and a drain opening through the etch mask, through the implant mask, and through the gate layer;

removing the etch mask;

implanting dopants into the channel layer to form source and drain areas wherein the implanting is performed through the source and drain openings;

activating the dopants in the channel layer;

evaporating ohmic contact material onto the source and drain areas;

covering the ohmic contact material that is on the source and drain areas with a protective layer;

removing ohmic contact material that is not on the source and drain areas;

removing the protective layer;

annealing the ohmic contact material that is on the source and drain areas;

forming a gate contact on the gate layer between the source area and the drain area; and using the gate contact as a mask while removing any of the gate layer not covered by the gate contact.

8. The method of claim 7 wherein forming the implant mask on the gate layer includes forming an implant mask that is one of polysilicon, silicon dioxide, and polycrystalline silicon carbide.

9. The method of claim 7 wherein applying the etch mask on the implant mask includes forming a layer of material that is one of nickel, platinum, and lanthanum hexaboride then patterning the layer of material.

10. The method of claim 7 wherein evaporating ohmic contact material includes evaporating nickel.

11. The method of claim 7 further including removing the implant mask prior to activating the dopants in the channel layer.

12. A method of forming a silicon carbide JFET comprising:

providing a silicon carbide substrate having a silicon carbide channel layer on the substrate;

forming a silicon carbide gate layer on the channel layer;

forming an implant mask on the gate layer;

applying a metal layer on the implant mask for use as an etch mask;

patterning the etch mask for a source opening and a drain opening;

etching the implant mask through the source opening and the drain opening in the etch mask for forming source and drain openings in the implant mask;

etching the gate layer through the source opening and the drain opening in the implant mask;

removing the etch mask for forming source and drain openings in the gate layer;

implanting dopants into the channel layer through the source and drain openings to form source and drain areas in the channel layer;

activating the dopants in the channel layer;

evaporating ohmic contact material onto the surface of the implant mask and onto the source and drain areas;

covering the ohmic contact material that is on the source and drain areas with a protective layer;

removing the ohmic contact material from the surface of the implant mask;

removing the implant mask;

removing the protective layer;

annealing the source and drain areas;

forming a gate contact on the gate layer between the source area and the drain area; and using the gate contact as a mask while removing any of the gate layer not covered by the gate contact.

* * * * *